(12) United States Patent
Sutardja

(10) Patent No.: US 7,541,962 B2
(45) Date of Patent: Jun. 2, 2009

(54) PIPELINED ANALOG-TO-DIGITAL CONVERTERS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 245 days.

(21) Appl. No.: 11/333,935

(22) Filed: Jan. 18, 2006

(65) Prior Publication Data

US 2007/0164891 A1    Jul. 19, 2007

(51) Int. Cl.
*H03M 1/38* (2006.01)
(52) U.S. Cl. .................................. 341/161; 341/155
(58) Field of Classification Search ............... 341/155, 341/161, 144, 118, 120, 156
See application file for complete search history.

(56) References Cited

U.S. PATENT DOCUMENTS

| 5,394,148 A | 2/1995 | Matsuura et al. |
| 5,682,163 A | 10/1997 | Hsu |
| 5,784,016 A | 7/1998 | Nagaraj |
| 5,966,088 A | 10/1999 | Matsumoto et al. |
| 6,606,048 B1 | 8/2003 | Sutardja |
| 6,710,735 B1 * | 3/2004 | Lin ............................ 341/161 |
| 6,839,015 B1 | 1/2005 | Sutardja et al. |
| 2004/0189507 A1 | 9/2004 | Wada et al. |
| 2005/0078025 A1 | 4/2005 | Cai |
| 2006/0114141 A1 * | 6/2006 | Nandi et al. ................ 341/155 |
| 2006/0145908 A1 * | 7/2006 | Lee ............................ 341/161 |

OTHER PUBLICATIONS

Communication from the European Patent Office dated Feb. 21, 2007 with the extended European Search Report for Application No. 06024141.1 - 2206; 6 pages.

* cited by examiner

*Primary Examiner*—Peguy JeanPierre

(57) ABSTRACT

A pipelined analog to digital converter comprises a first ADC stage thatccc receives one of an input voltage and a first residue voltage and a first voltage reference and that generates a first digital signal and a second residue voltage. A second ADC stage receives the second residue voltage from the first ADC stage and a second voltage reference and that generates a second digital signal, wherein the second voltage reference is lower than the first voltage reference.

32 Claims, 9 Drawing Sheets

PIPELINED ANALOG-TO-DIGITAL CONVERTERS

FIELD

The present disclosure relates to pipelined analog-to-digital converters (ADCs).

BACKGROUND

Reducing power consumption of electronic devices has become increasingly important, particularly for battery powered devices such as laptop computers, personal digital assistants, cellular phones, MP3 players and other devices. Analog-to-digital converters (ADCs) are commonly used in these electronic devices to transform analog signals to digital signals. The ADC may include a pipelined ADC that utilizes multiple stages. Each stage employs a sample and hold circuit that samples an analog input voltage $V_{in}$ to the pipelined ADC or a residue voltage $V_{res}$ from a prior stage. In addition, each of the stages receives a reference voltage $V_{ref}$.

Referring now to FIG. 1, a typical pipelined ADC 10 is shown. The ADC 10 includes a plurality of stages 12-1, 12-2, and 12-3 (collectively stages 12) that are cascaded in series. Although three stages 12-1, 12-2, and 12-3 are shown, the pipelined ADC 10 may include additional or fewer stages. Some of the A/D converter stages 12 include a sample and hold module 14 that samples and holds the analog input signal $V_{in}$ or the residue signal $V_{res}$ from a prior stage. A low resolution A/D subconverter module 16 quantizes the held analog signal to a resolution of $B_i$ bits where i corresponds to the current stage of the pipelined A/D converter 10. The number of bits per stage $B_i$ and/or the number of stages may be determined in part by the desired sampling rate and resolution. The output of the A/D subconverter module 16 is supplied to a low-resolution D/A subconverter module 18 that converts the resulting digital output signal back into an analog representation.

The D/A subconverter module 18 may have a resolution that is equivalent to that of the corresponding A/D subconverter module 16 of the same stage. A difference module 20 subtracts the analog output from the D/A subconverter module 18 from the voltage input $V_{in}$ to generate a residue signal $V_{res}$. The residue signal $V_{res}$ is equal to the difference between the held analog signal ($V_{in}$ or $V_{res}$ from the prior stage) and the reconstructed analog signal.

An analog interstage difference module 22 may be used to amplify the residue signal. The amplified residue signal is output to the next stage 12-2 of the pipelined ADC 10. The first ADC stage 12-1 of the pipelined ADC 10 operates on a most current analog input sample while the second ADC stage 12-2 operates on the amplified residue of the prior input sample. The third stage 12-3 operates on the amplified residue output by the second ADC stage 12-2.

The concurrency of operations allows a conversion speed that is determined by the time it takes in one stage. Once a current stage has completed operating on the analog input sample received from the prior stage, the current stage is available to operate on the next sample.

SUMMARY

A pipelined analog to digital converter comprises a first ADC stage that receives one of an input voltage and a first residue voltage and a first voltage reference and that generates a first digital signal and a second residue voltage. A second ADC stage receives the second residue voltage from the first ADC stage and a second voltage reference and that generates a second digital signal. The second voltage reference is lower than the first voltage reference.

A system comprises the pipelined analog to digital converter and further comprises a first voltage source that supplies the first voltage reference. A second voltage source supplies the second voltage reference. An analog circuit receives the first voltage reference. A digital circuit receives the second voltage reference.

An integrated circuit comprises the pipelined analog to digital converter and further comprises a first voltage source that supplies the first voltage reference. A second voltage source supplies the second voltage reference. An analog circuit receives the first voltage reference. A digital circuit receives the second voltage reference.

In other features, the first ADC stage further comprises a sample and hold module that samples and holds the one of the input voltage and the first residue voltage. An analog to digital converter converts an output of the sample and hold module to a digital signal. A digital to analog converter converts the digital signal to an analog signal. The first ADC stage further comprises a difference module that generates a difference between the output of the sample and hold module and the analog signal. An amplifier module amplifies the difference.

An integrated circuit comprises the pipelined analog to digital converter and further comprises an analog voltage supply that generates the first voltage reference. The first voltage reference is an analog voltage reference. A digital voltage supply generates the second voltage reference. The second voltage reference is a digital voltage reference.

A system comprises the pipelined analog to digital converter and further comprises an analog voltage supply that generates the first voltage reference. The first voltage reference is an analog voltage reference. A digital voltage supply generates the second voltage reference. The second voltage reference is a digital voltage reference.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
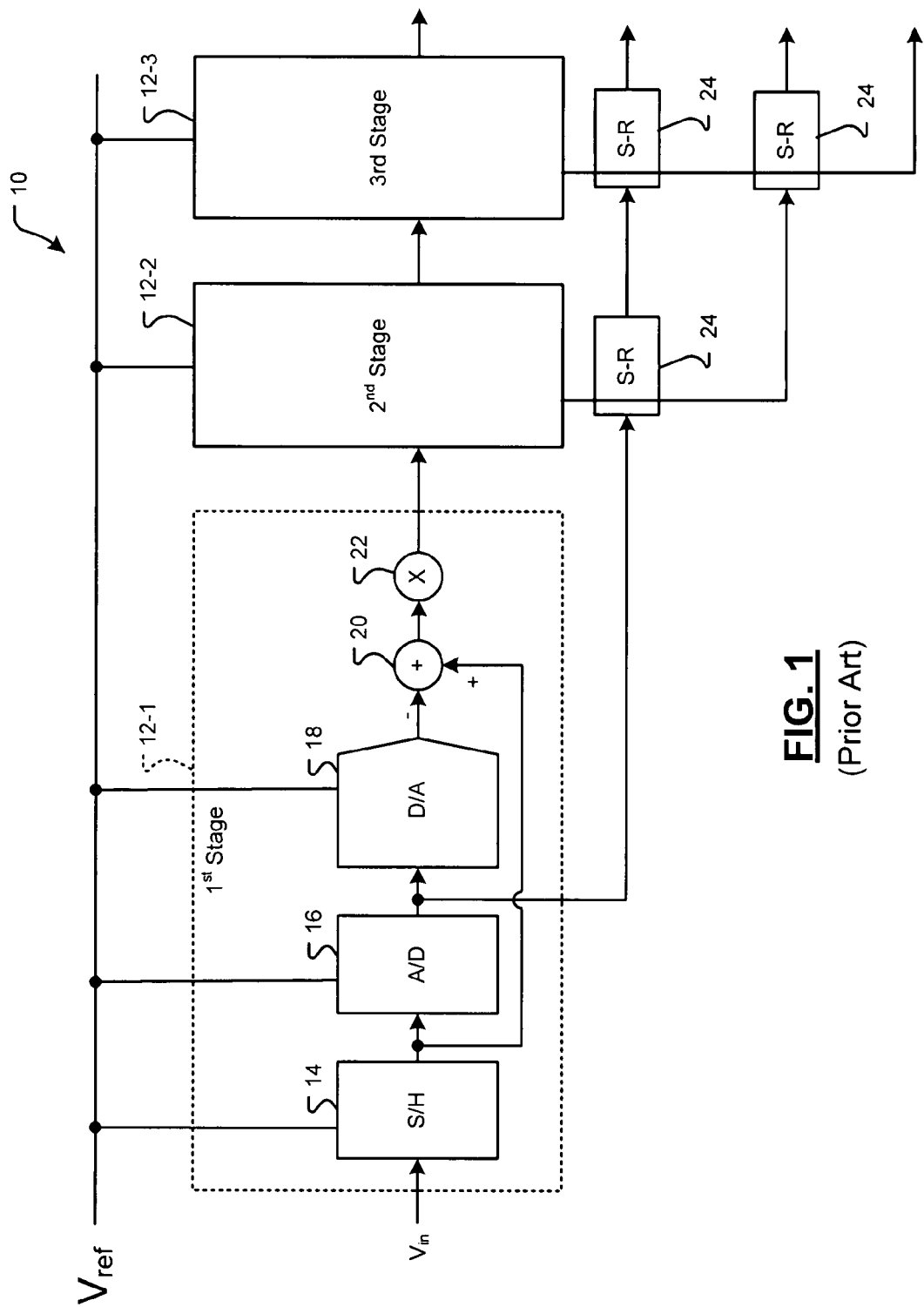
FIG. 1 is a functional block diagram of a pipelined analog to digital converter (ADC) according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 2:
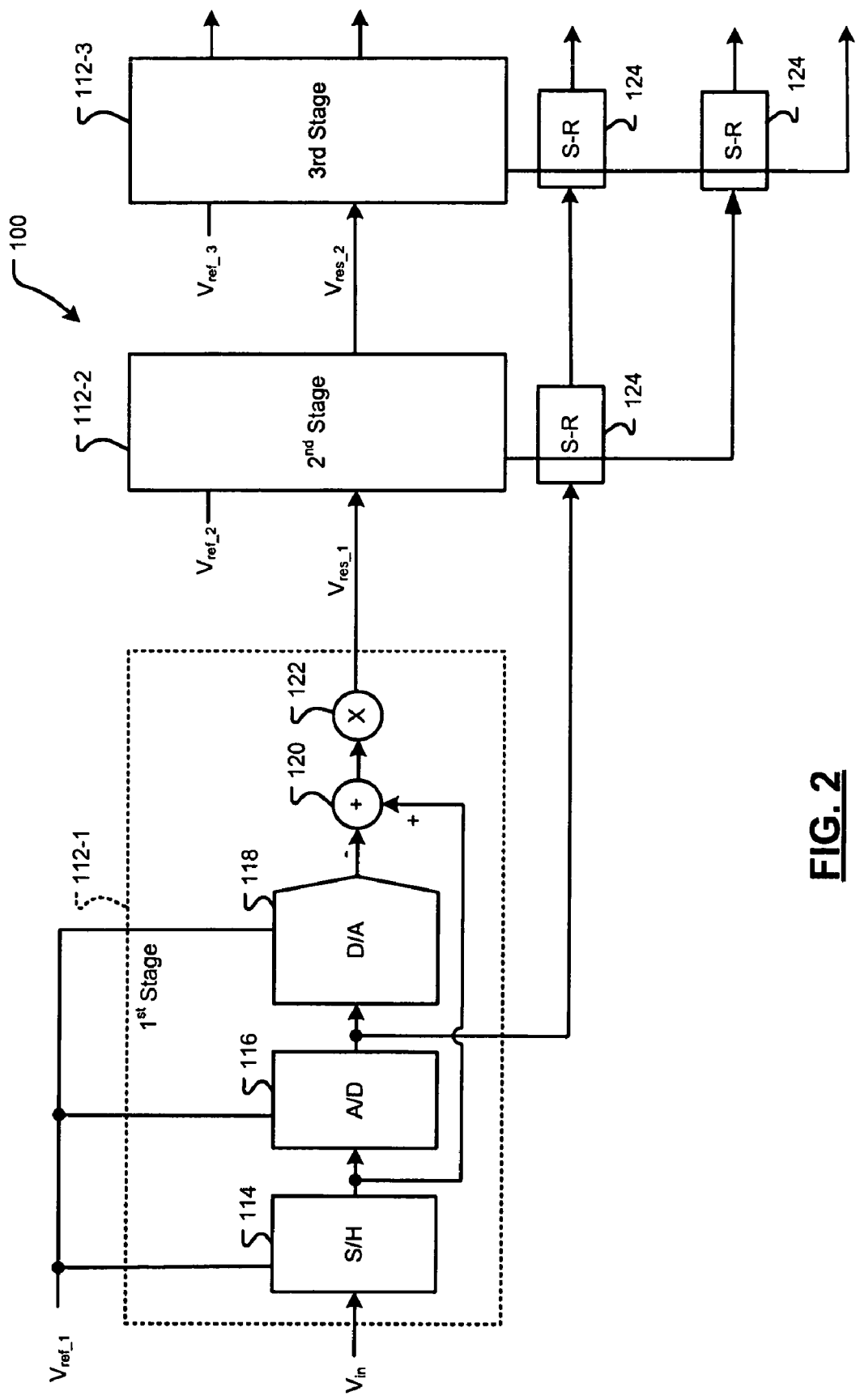
FIG. 2 is a functional block diagram of an exemplary pipelined ADC according to the present invention.

Referring now to FIG. 2, a pipelined ADC 100 according to the present invention including multiple voltage references $V_{ref\_i}$ is shown, where i corresponds to the current stage of the pipelined ADC 100. The pipelined ADC 100 includes stages 112-1, 112-2, and 112-3 (collectively stages 112), a sample and hold module 114, an ADC module 116, a digital to analog converter (DAC) module 118, a difference module 120 and an amplifier module 122. While three stages are shown, additional or fewer stages can be used. In FIG. 2, $V_{ref\_1} \geq V_{ref\_2}$ and $V_{ref\_1} > V_{ref\_3}$. The quantization of bits by a subsequent stage of the pipelined ADC 100 does not require the same signal to noise levels (SNR) as the current stage and therefore a lower reference voltage can be used for at least one of the second and third stages.

The power consumed by stages 112-1, 112-2, and 112-3 of the pipelined ADC 100 is related to the voltage reference of each stage. As a result, the pipelined ADC 100 tends to consume less power than a pipelined ADC having stages supplied with the same voltage reference as shown in FIG. 1.

Figure 3:
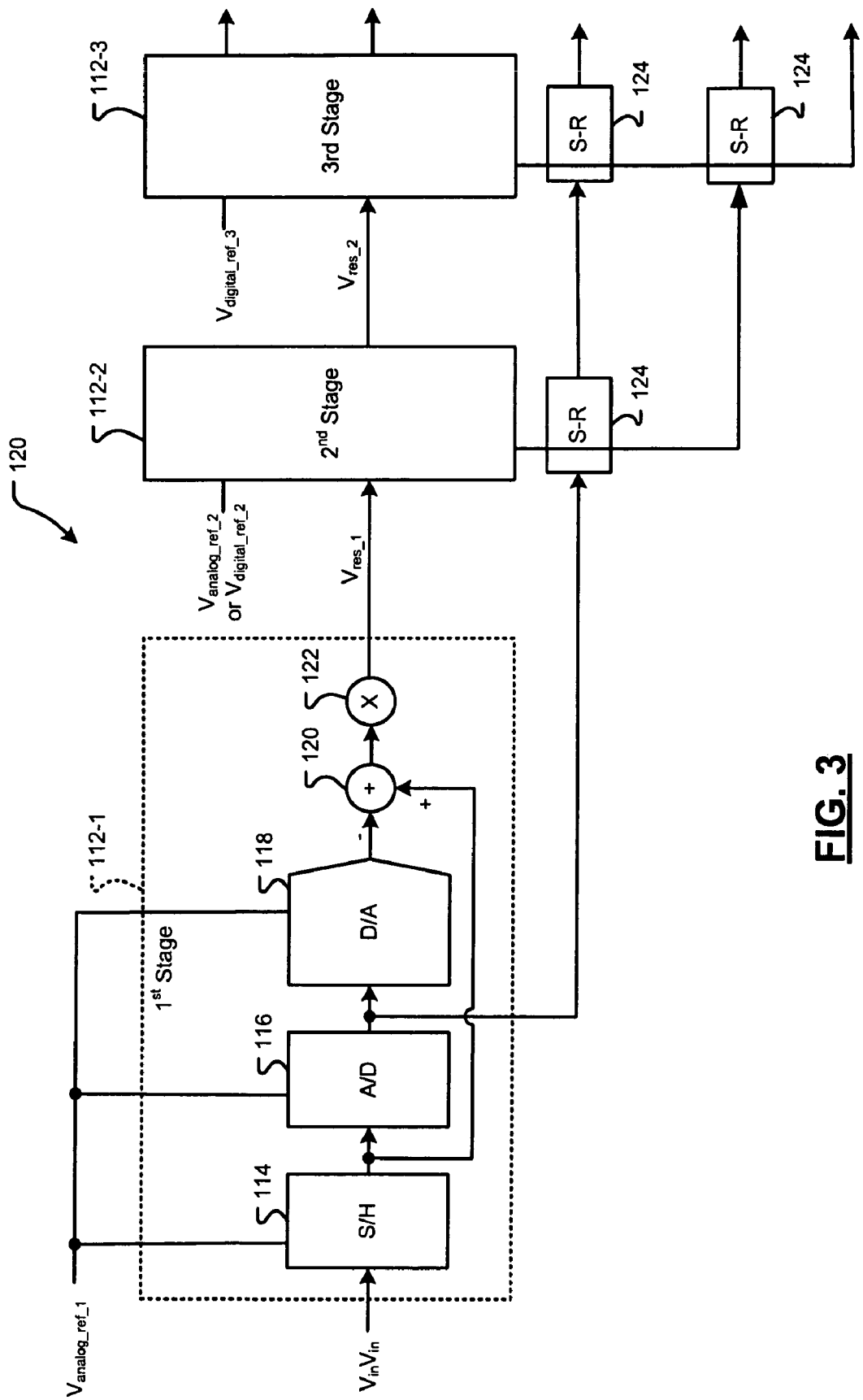
FIG. 3 is a functional block diagram of another exemplary pipelined ADC according to the present invention.

Referring now to FIG. 3, a pipelined ADC 120 including different voltage references, $V_{ref\_i}$ is shown, where i corresponds to the current stage of the pipelined A/D converter 120. At least one of the voltage references $V_{ref\_i}$ is derived from an analog supply voltage $V_{analog\_ref}$ for analog circuits in the system containing the ADC 120 and at least one of the voltage references is derived from a digital supply voltage $V_{digital\_ref}$ for digital circuit in the system containing the ADC 120.

Figure 4:
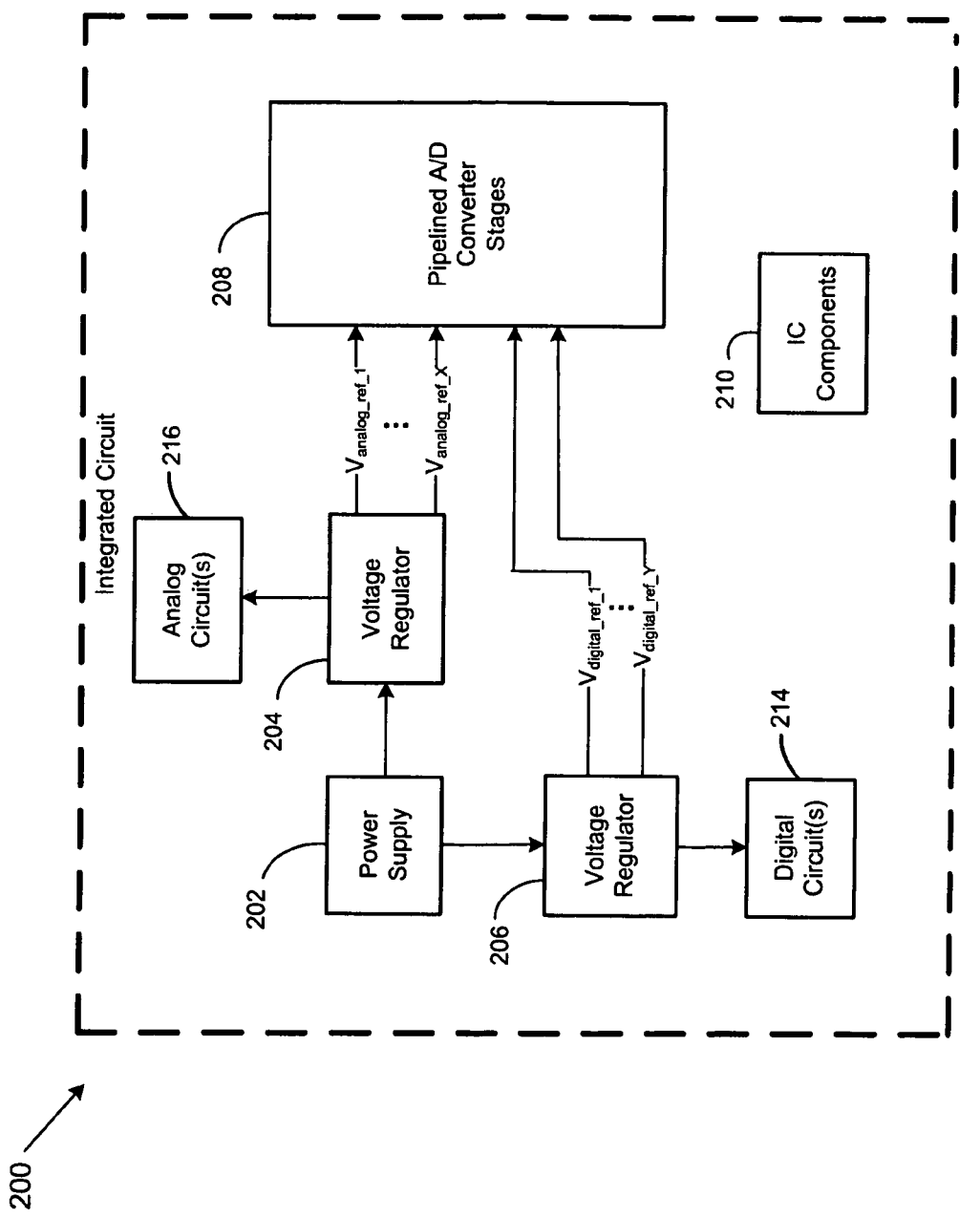
FIG. 4 is a functional block diagram of an integrated circuit including a pipelined ADC according to the present invention.

Referring now to FIG. 4, an integrated circuit (IC) 200 is shown. One or more power supply 202 supplies unregulated voltage to voltage regulators 204 and 206. A first voltage regulator 204 provides analog supply voltages, $V_{analog\_ref\_1}$, $V_{analog\_ref\_2}$, ..., and $V_{analog\_ref\_X}$, where X is an integer greater than zero. A second voltage regulator 206 provides digital supply voltages, $V_{digital\_ref\_1}$, $V_{digital\_ref\_2}$, ..., and $V_{digital\_ref\_Y}$, where Y is an integer greater than zero. The IC 200 may also include IC components 210 to perform additional circuit functions. The first voltage regulator 204 also supplies one or more analog circuits 216 in the IC 200. The second voltage regulator 206 also supplies one or more digital circuits 214.

Figure 5:
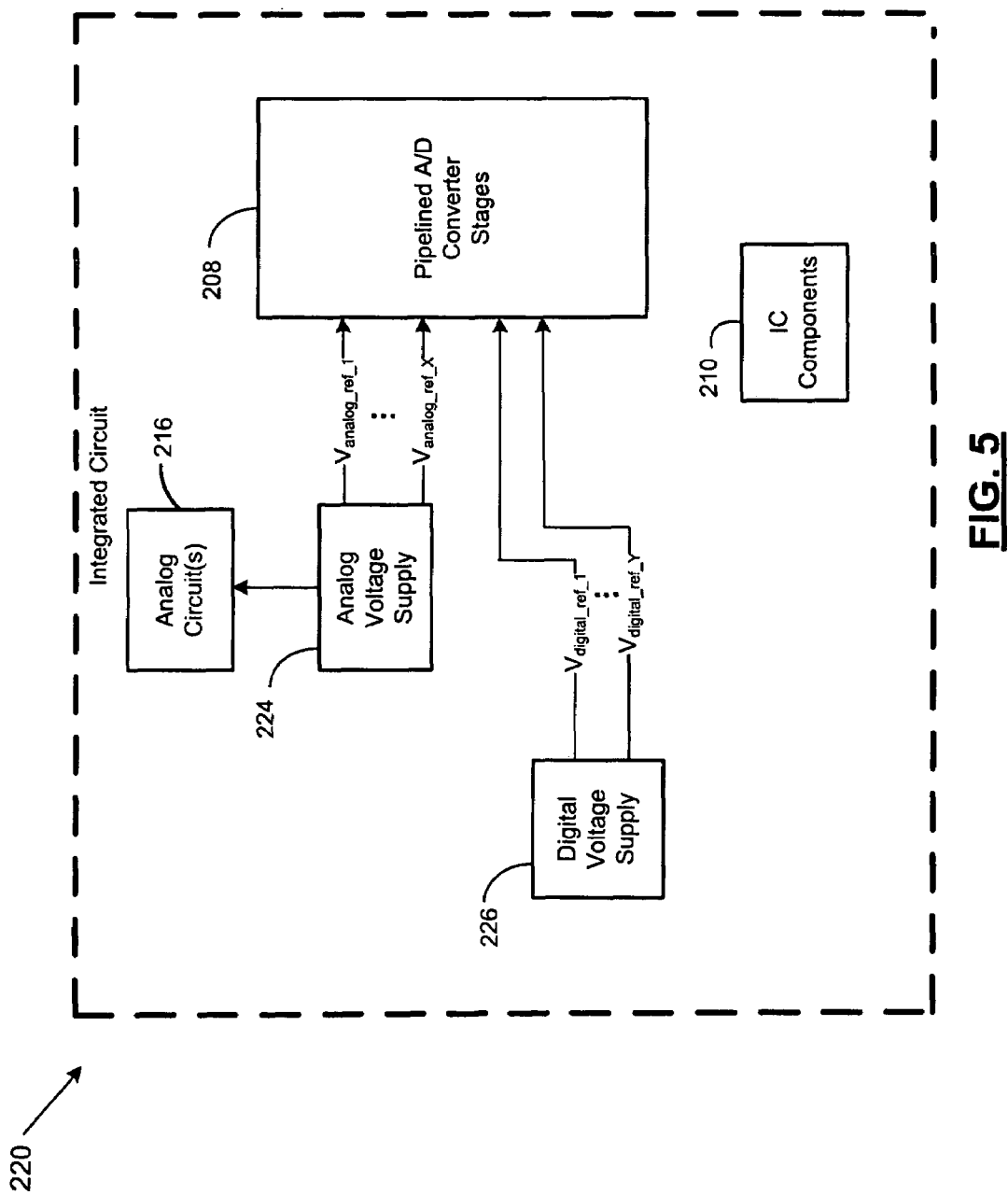
FIG. 5 is a functional block diagram of an integrated circuit including an analog voltage supply, a digital voltage supply, and a pipelined ADC according to the present invention.

Referring now to FIG. 5, an integrated circuit (IC) 220 is shown. An analog voltage supply 224 generates analog supply voltages; $V_{analog\_ref\_1}$, $V_{analog\_ref\_2}$, ..., and $V_{analog\_ref\_X}$, where X is an integer greater than zero. A digital voltage supply 226 generates digital supply voltages, $V_{digital\_ref\_1}$, $V_{digital\_ref\_2}$, ..., and $V_{digital\_ref\_Y}$, where Y is an integer greater than zero. The IC 220 may also include IC components 210 to perform additional circuit functions. The analog voltage supply 224 also supplies one or more analog circuits 216 in the IC 200. The digital voltage supply 226 also supplies one or more digital circuits 214.

Figure 6B:
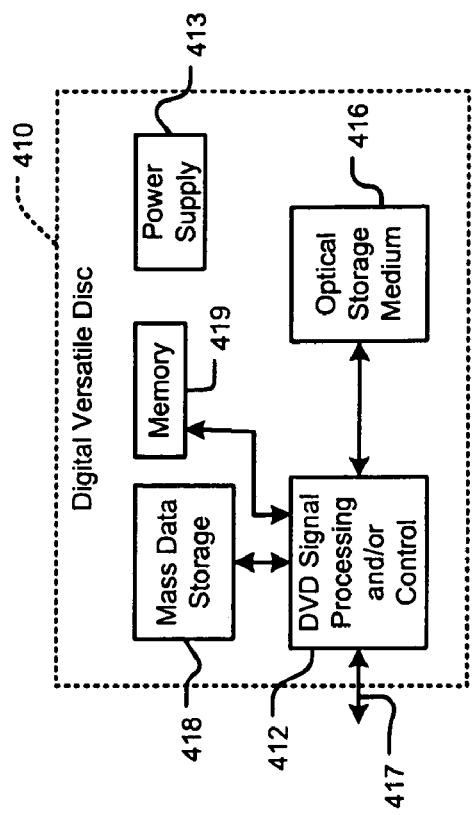
FIG. 6B is a functional block diagram of a digital versatile disk (DVD)
Figure 6A:
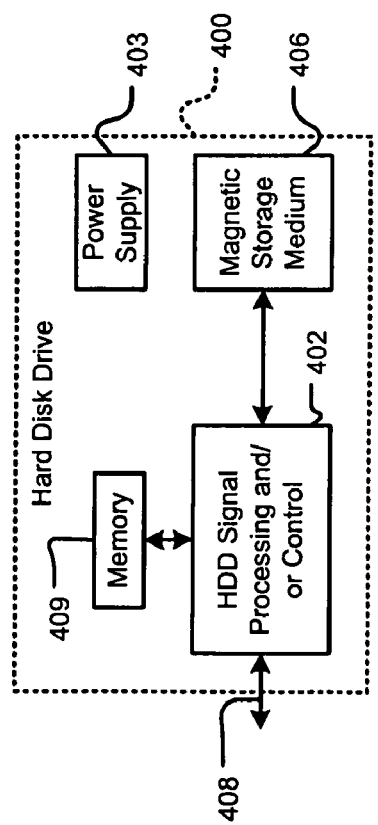
FIG. 6A is a functional block diagram of a hard disk drive.

Referring now to FIGS. 6A-6G, various exemplary implementations of the device are shown. Referring now to FIG. 6A, the device can be implemented in one of more ADCs in a hard disk drive 400. The device may implement and/or be implemented in either or both signal processing and/or control circuits, which are generally identified in FIG. 6A at 402 and/or in a power supply 403. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 6B, the device can be implemented in one of more ADCs in a digital versatile disc (DVD) drive 410. The device may implement and/or be implemented in either or both signal processing and/or control circuits, which are generally identified in FIG. 6B at 412, mass data storage of the DVD drive 410 and/or a power supply 413. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 6A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 6D:
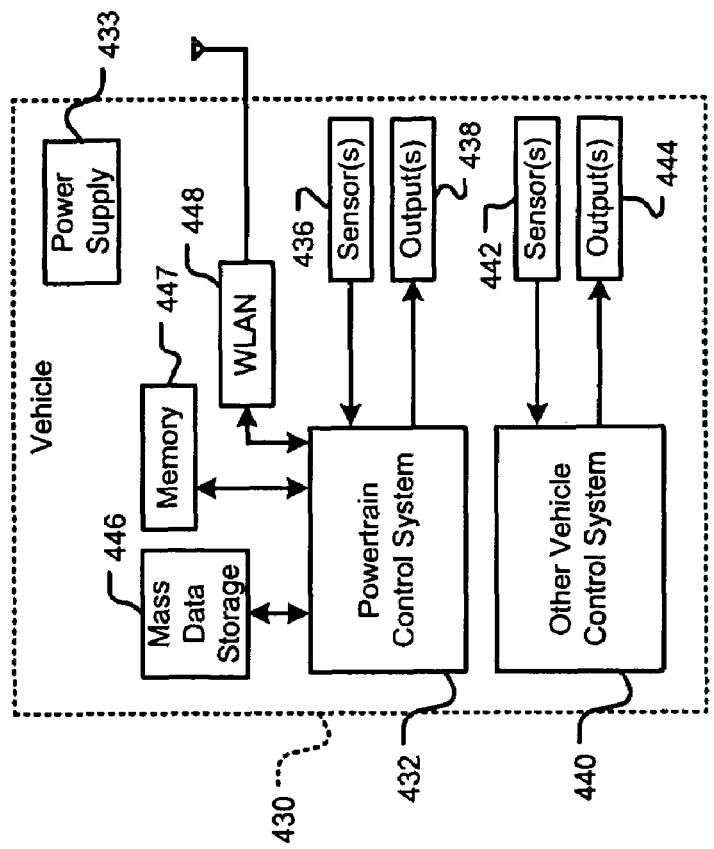
FIG. 6D is a functional block diagram of a vehicle control system.
Figure 6C:
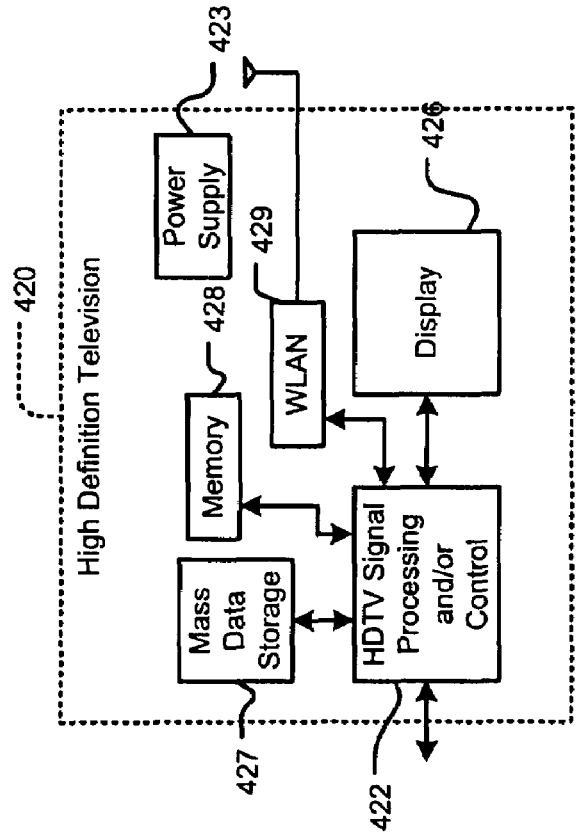
FIG. 6C is a functional block diagram of a high definition television.

Referring now to FIG. 6C, the device can be implemented in one of more ADCs in a high definition television (HDTV) 420. The device may implement and/or be implemented in either or both signal processing and/or control circuits, which are generally identified in FIG. 6E at 422, a WLAN interface, mass data storage of the HDTV 420 and/or a power supply 423.] The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 6D, the device may implement and/or be implemented in one of more ADCs in a control system of a vehicle 430, a WLAN interface, mass data storage of the vehicle control system and/or a power supply 433. In some implementations, the device implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The device may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 6E:
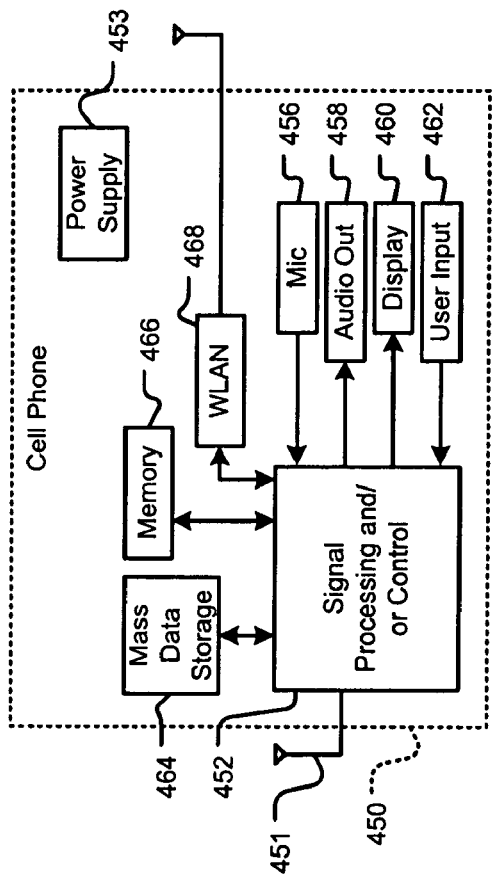
FIG. 6E is a functional block diagram of a cellular phone.

Referring now to FIG. 6E, the device can be implemented in one of more ADCs in a cellular phone 450 that may include a cellular antenna 451. The device may implement and/or be implemented in either or both signal processing and/or control circuits, which are generally identified in FIG. 6E at 452, a WLAN interface, mass data storage of the cellular phone 450 and/or a power supply 453. In some implementations, the cellular phone 450 includes a microphone 456, an audio output 458 such as a speaker and/or audio output jack, a display 460 and/or an input device 462 such as a keypad, pointing device, voice actuation and/or other input device.

The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 6F:
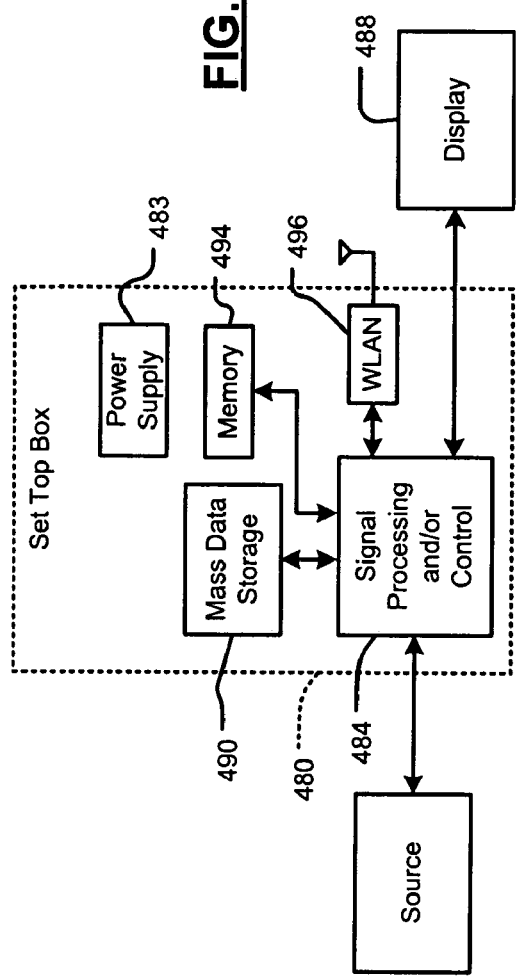
FIG. 6F is a functional block diagram of a set top box.

Referring now to FIG. 6F, the device can be implemented in one of more ADCs in a set top box 480. The device may implement and/or be implemented in either or both signal processing and/or control circuits, which are generally identified in FIG. 6F at 484, a WLAN interface, mass data storage of the set top box 480 and/or a power supply 483. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 6G:
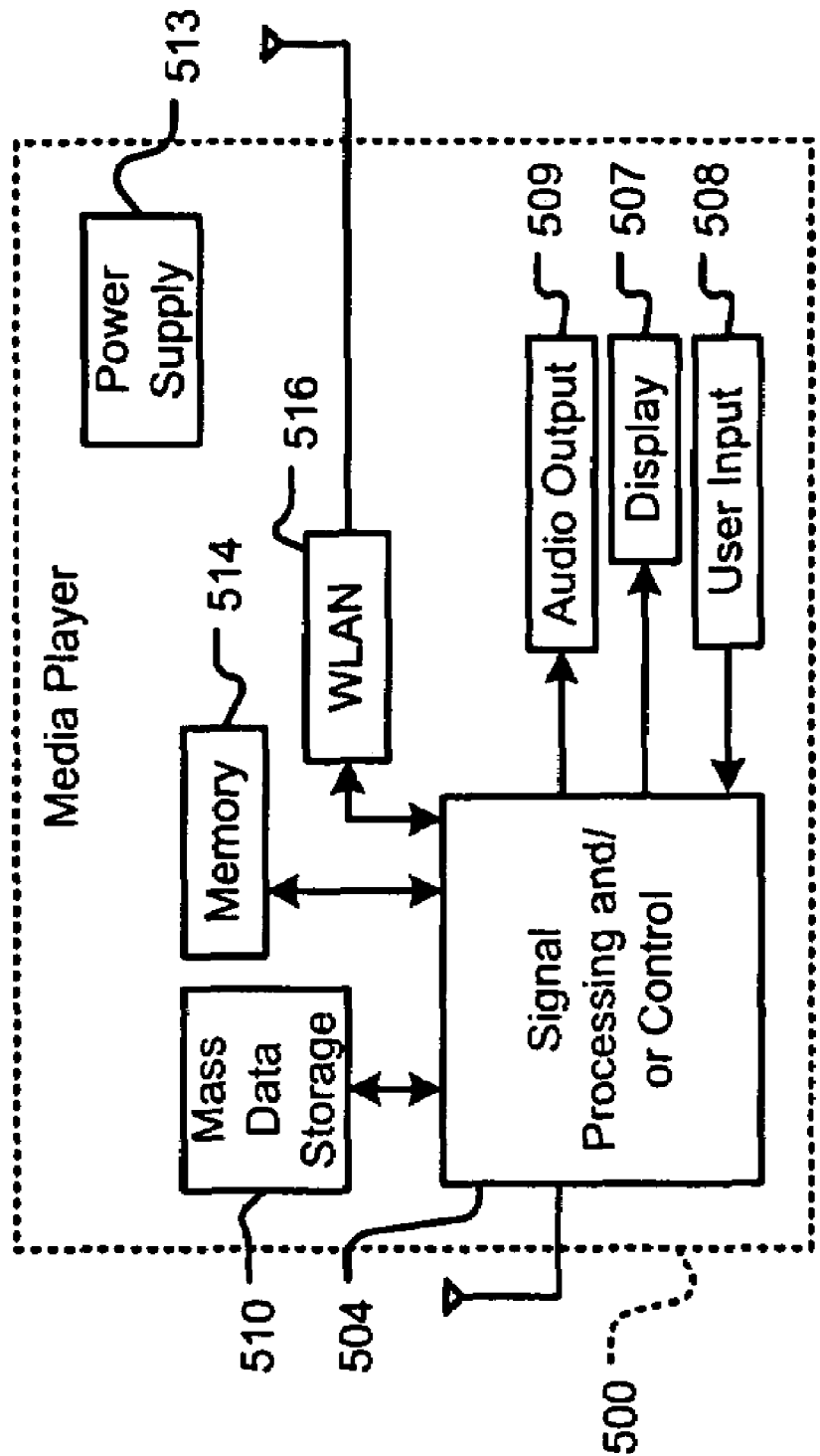
FIG. 6G is a functional block diagram of a media player.

Referring now to FIG. 6G, the device can be implemented in one of more ADCs in a media player 500. The device may implement and/or be implemented in either or both signal processing and/or control circuits, which are generally identified in FIG. 6G at 504, a WLAN interface, mass data storage of the media player 500 and/or a power supply 503. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A pipelined analog to digital converter (ADC), comprising:
   a first ADC stage that receives an input voltage, that receives a first voltage reference, and that generates a first digital signal and a first residue voltage;
   a second ADC stage that receives said first residue voltage and a second voltage reference and that generates a second digital signal; and
   a digital voltage supply that generates said second voltage reference,
   wherein said second voltage reference is lower than said first voltage reference, and wherein at least one of said first voltage reference and said second voltage reference is a digital reference.

2. A system comprising the pipelined analog to digital converter of claim 1 and further comprising:
   a first voltage source that supplies said first voltage reference; and
   a second voltage source that supplies said second voltage reference.

3. The system of claim 2 further comprising:
   an analog circuit that receives said first voltage reference; and
   a digital circuit that receives said second voltage reference.

4. An integrated circuit comprising the pipelined analog to digital converter of claim 1 and further comprising:
   a first voltage source that supplies said first voltage reference; and
   a second voltage source that supplies said second voltage reference.

5. The integrated circuit of claim 4 further comprising:
   an analog circuit that receives said first voltage reference; and
   a digital circuit that receives said second voltage reference.

6. The integrated circuit of claim 4 wherein said first voltage source and said second voltage source include voltage regulators.

7. The integrated circuit of claim 6 wherein said first voltage source and said second voltage source receive power from a common power supply.

8. The integrated circuit of claim 4 wherein said first voltage source is independent of said second voltage source.

9. The pipelined analog to digital converter of claim 1 wherein said first ADC stage further comprises:
   a sample and hold module that samples and holds said one of said input voltage and said first residue voltage;
   an analog to digital converter that converts an output of said sample and hold module to a digital signal; and
   a digital to analog converter that converts said digital signal to an analog signal.

10. The pipelined analog to digital converter of claim 6 wherein said first ADC stage further comprises:
    a difference module that generates a difference between said output of said sample and hold module and said analog signal; and
    an amplifier module that amplifies said difference.

11. An integrated circuit comprising the pipelined analog to digital converter of claim 1 and further comprising:
    an analog voltage supply that generates said first voltage reference, wherein said first voltage reference is an analog voltage reference; and
    a digital voltage supply that generates said second voltage reference, wherein said second voltage reference is a digital voltage reference.

12. A system comprising the pipelined analog to digital converter of claim 1 and further comprising an analog voltage supply that generates said first voltage reference, wherein said first voltage reference is an analog voltage reference.

13. The pipelined ADC of claim 1 further comprising at least one additional ADC stage that receives a third voltage reference that is one of an analog reference or a digital reference.

14. A pipelined analog to digital converter (ADC), comprising:
    first ADC stage means for receiving an input voltage, for receiving a first voltage reference, and for generating a first digital signal and a first residue voltage;
    second ADC stage means for receiving said first residue voltage and a second voltage reference and for generating a second digital signal; and
    digital supply means for generating said second voltage reference,
    wherein said second voltage reference is lower than said first voltage reference, and wherein said second voltage reference is independent of said first voltage reference.

15. A system comprising the pipelined analog to digital converter of claim 14 and further comprising:
    first voltage means for supplying said first voltage reference; and
    second voltage means for supplying said second voltage reference.

16. The system of claim 15 further comprising:
    analog means for receiving said first voltage reference; and
    digital means for receiving said second voltage reference.

17. The system of claim 15 wherein said first voltage means and said second voltage means receive power from a common power supply means.

18. An integrated circuit comprising the pipelined analog to digital converter of claim 14 and further comprising:
    first voltage means for supplying said first voltage reference; and
    second voltage means for supplying said second voltage reference.

19. The integrated circuit of claim 18 further comprising:
    analog means for receiving said first voltage reference; and
    digital means for receiving said second voltage reference.

20. The pipelined analog to digital converter of claim 14 wherein said first ADC stage further comprises:

sample and hold means for sampling and holding said one of said input voltage and said first residue voltage;

analog to digital converting means for converting an output of said sample and hold means to a digital signal; and digital to analog converting means for converting said digital signal to an analog signal.

21. The pipelined analog to digital converter of claim 20 wherein said first ADC stage means further comprises:

difference means for generating a difference between said output of said sample and hold means and said analog signal; and amplifying means for amplifying said difference.

22. An integrated circuit comprising the pipelined analog to digital converter of claim 14 and further comprising:

analog supply means for generating said first voltage reference, wherein said first voltage reference is an analog voltage reference; and digital supply means for generates said second voltage reference, wherein said second voltage reference is a digital voltage reference.

23. A system comprising the pipelined analog to digital converter of claim 14 and further comprising analog supply means for generating said first voltage reference, wherein said first voltage reference is an analog voltage reference.

24. The pipelined ADC of claim 14 further comprising at least one additional ADC means that receives a third voltage reference that is independent of at least one of said first voltage reference and said second voltage reference.

25. A method for operating a pipelined analog to digital converter, comprising:

receiving one of an input voltage and a first residue voltage at a first ADC stage;

receiving a first voltage reference at said first ADC stage;

generating a first digital signal and a second residue voltage;

receiving said second residue voltage from said first ADC stage and a second voltage reference at a second ADC stage;

generating a second digital signal, wherein said second voltage reference is lower than said first voltage reference; and receiving a third voltage reference at a third ADC stage that is lower than said second voltage reference.

26. The method of claim 25 further comprising:

generating said first voltage reference using a first voltage source; and generating said second voltage reference using a second voltage source.

27. The method of claim 26 further comprising:

supplying said first voltage reference to an analog circuit; and supplying said second voltage reference to a digital circuit.

28. The method of claim 25 further comprising:

sampling and holding said one of said input voltage and said first residue voltage;

converting an output of said sample and hold module to a digital signal; and converting said digital signal to an analog signal.

29. The method of claim 28 further comprising:

generating a difference between an output of said sampling and holding and said analog signal; and amplifying said difference.

30. The method of claim 25 further comprising:

using an analog voltage supply to generate said first voltage reference, wherein said first voltage reference is an analog voltage reference; and using a digital voltage supply to generate said second voltage reference, wherein said second voltage reference is a digital voltage reference.

31. A pipelined analog to digital converter (ADC), comprising:

an ADO stage that receives a residue voltage, that receives a voltage reference, and that generates a digital signal and another residue voltage;

another ADO stage that receives said another residue voltage and another voltage reference and that generates another digital signal; and a digital voltage supply that generates said another voltage reference, wherein said another voltage reference is lower than said voltage reference, and wherein at least one of said voltage reference and said another voltage reference is a digital reference.

32. A pipelined analog to digital converter (ADO), comprising:

ADC stage means for receiving a residue voltage, for receiving a voltage reference, and for generating a digital signal and another residue voltage;

another ADO stage means for receiving said another residue voltage and another voltage reference and for generating another digital signal; and digital supply means for generating said another voltage reference, wherein said another voltage reference is lower than said voltage reference, and wherein said another voltage reference is independent of said voltage reference.

* * * * *

UNITED STATES PATENT AND TRADEMARK OFFICE
CERTIFICATE OF CORRECTION

PATENT NO. : 7,541,962 B2  Page 1 of 1
APPLICATION NO. : 11/333935
DATED : June 2, 2009
INVENTOR(S) : Sehat Sutardja It is certified that error appears in the above-identified patent and that said Letters Patent is hereby corrected as shown below:

| | |
|---|---|
| Title Page; item (57); | Under "ABSTRACT", second line delete "thatccc" and insert -- that -- |
| Column 4, Line 66 | Delete "]" after "423" |
| Column 9, Line 18 | Delete "generates" and insert -- generating -- |
| Column 10, Line 24 | Delete "ADO" and insert -- ADC -- |
| Column 10, Line 27 | Delete "ADO" and insert -- ADC -- |
| Column 10, Line 36 | Delete "ADO" and insert -- ADC -- |
| Column 10, Line 41 | Delete "ADO" and insert -- ADC -- |

Signed and Sealed this

Twenty-eighth Day of July, 2009

JOHN DOLL
*Acting Director of the United States Patent and Trademark Office*